United States Patent [19]

Knauer

[11] Patent Number: 4,856,457
[45] Date of Patent: Aug. 15, 1989

[54] CLUSTER SOURCE FOR NONVOLATILE SPECIES, HAVING INDEPENDENT TEMPERATURE CONTROL

[75] Inventor: Wolfgang Knauer, Malibu, Calif.

[73] Assignee: Hughes Aircraft Company, Los Angeles, Calif.

[21] Appl. No.: 17,389

[22] Filed: Feb. 20, 1987

[51] Int. Cl.$^4$ .............................................. B05C 11/00
[52] U.S. Cl. ................................... 118/666; 118/50.1; 118/620; 118/726
[58] Field of Search ...................... 118/666, 50.1, 620, 118/726

[56] References Cited

U.S. PATENT DOCUMENTS 4,217,855  8/1980  Takagi ............................ 118/726 X
4,286,545  9/1981  Takagi et al. .................... 118/726 X Primary Examiner—Bernard Pianalto
Attorney, Agent, or Firm—Wanda K. Denson-Low

[57] ABSTRACT

A cluster source includes at least two separate zones, each of whose temperatures can be independently controlled. A crucible contains the species to be evaporated, and is heated to a sufficiently high temperature that efficient evaporation is achieved. A cluster formation surface is adjacent to the crucible and receives evaporated atoms from the crucible. Clusters are produced at the cluster formation surface from the evaporated atoms, and the cluster formation surface is maintained at a temperature lower than that of the crucible to encourage good formation efficiency. Optionally, a third zone can be provided for ejection of the clusters, which is maintained at a higher temperature than the cluster formation surface to prevent formation of droplets of the evaporant.

16 Claims, 2 Drawing Sheets

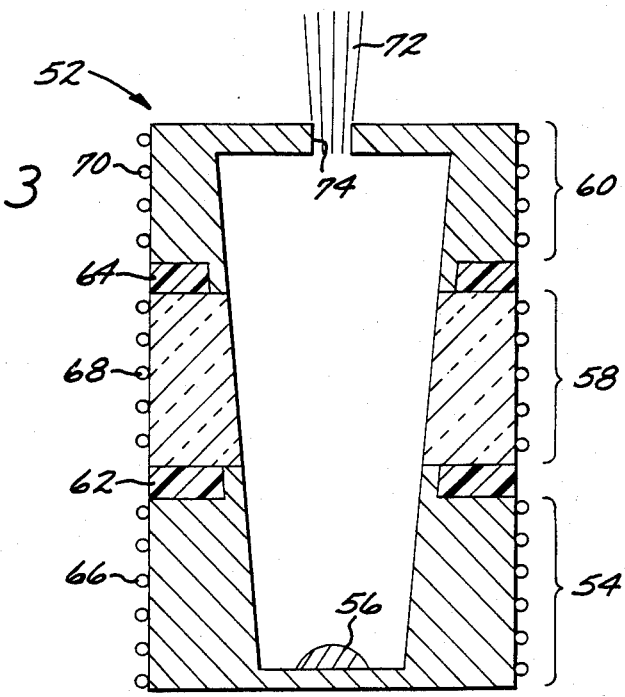
FIG. 3
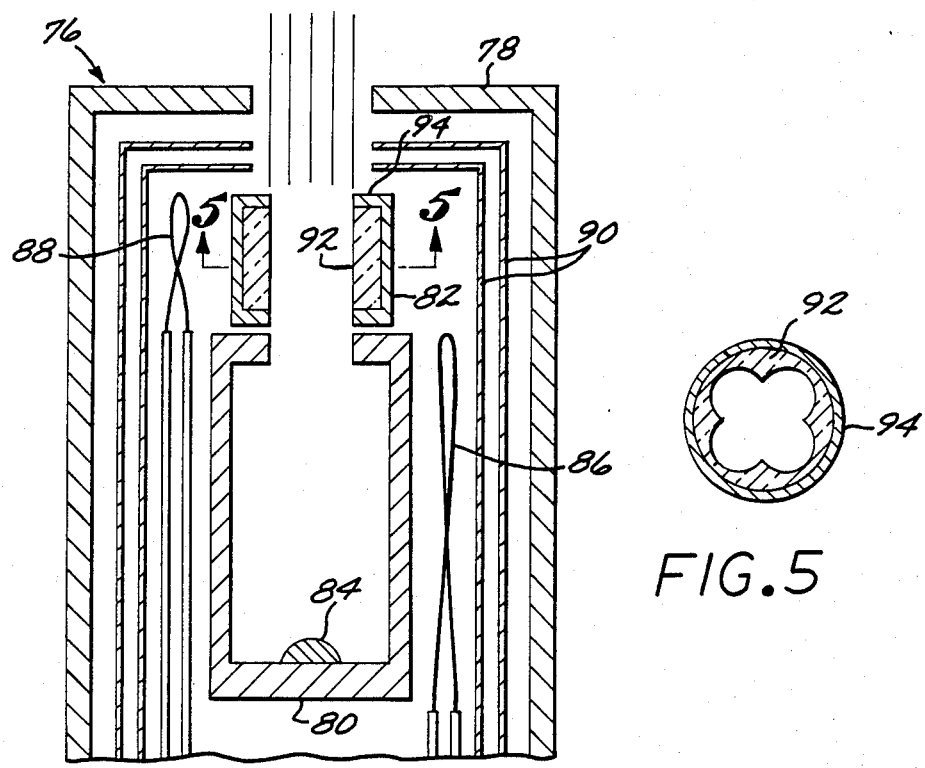
FIG. 4
FIG. 5

CLUSTER SOURCE FOR NONVOLATILE SPECIES, HAVING INDEPENDENT TEMPERATURE CONTROL

BACKGROUND OF THE INVENTION

This invention relates to the deposition of thin films, and, more particulary, to sources for cluster beams.

The deposition of thin films upon substrates is an important manufacturing and research tool in a variety of fields. For example, microelectronic devices are prepared by depositing succcssive film layers onto a substrate to obtain specific electronic properties of the composite. Photosensitive devices such as vidicons and solar cells are manufactured by depositing films of photosensitive materials onto substrates. Optical properties of lenses are improved by depositing films onto their surfaces. These examples are, of course, only illustrative of the thousands of applications of thin film deposition techniques.

In the highly controlled approach to thin-film deposition that is characteristic of applications where a high quality film is required, the film is built up by successive deposition of monolayers of the film, each layer being one atom thick. The mechanics of the deposition process can best be considered in atomistic terms. Generally, in such a process the surface of the substrate must be carefully cleaned, since minor contaminant masses or even contaminant atoms can significantly impede the deposition of the required highly perfect film. The material of the film is then deposited by one of many techniques developed for various applications, such as vapor deposition, electron beam evaporation, sputtering, or chemical vapor deposition, to name a few.

In another technique for depositing thin films, ionized clusters of atoms (or molecules) are formed in a cluster deposition apparatus. These clusters usually have on the order of about 1000-2000 atoms each. The clusters are ionized and then accelerated toward the substrate target by an electrical potential that imparts an energy to the cluster equal to the accelerating voltage times the ionization level of the cluster. Upon reaching the surface of the substrate, the clusters disintegrate at impact into atoms free to meve on the surface. Each atom fragment remaining after disintegration has an energy equal to the total energy of the cluster divided by the number of atoms in the cluster. Prior to disintegration the cluster therefore has a relatively high mass and energy, while each atom remaining after disintegration has a relatively low mass and energy. The energy of the atom deposited upon the surface gives it mobility on the surface, so that it can move to kinks or holes that might be present on the surface. The deposited atom comes to rest in the imperfections, thereby removing the imperfection and increasing the perfection and density of the film. Other approaches to using clusters have been developed, and thin film deposition using cluster beams is a promising commercial film manufacturing technique.

The cluster source, which produces the clusters, is a key component of a cluster beam deposition apparatus. The cluster source should produce a high mass flow of clusters of a selected size range, and exhibit a high cluster-forming efficiency. That is, the cluster beam should have a large fraction of the mass of the beam present as clusters rather than atoms, or the beneficial effect of using clusters may be lost. The cluster source should also provide a cluster beam with the clusters in the proper energetic state.

In one type of cluster source, the evaporative source, atoms are evaporated from a crucible within the source and fill the interior of the source. The source has an opening which functions as a nozzle through which a beam of clusters is emitted, and the nozzle produces a back pressure within the source so that the beam is emitted under pressure. The expansion of the beam through the nozzle has generally been thought to be the cause of the formation of clusters, as the reduced pressure in the expanded beam could cause homogeneous nucleation of clusters. A mixture of clusters and unclustered atoms is emitted from the source and progresses through the deposition apparatus to be deposited upon a target. The evaporative cluster source is distinguished from a carrier gas cluster source, wherein atoms are also evaporated but are mixed with a stream of a carrier gas to accelerate formation of clusters.

Existing evaporative cluster sources have suffered from the disadvantage of having a low cluster forming efficiency. That is, a high percentage of the atoms in the beam emitted from the source are emitted as unclustered atoms. After having been ionized, these atoms must be removed from the beam, or they will carry a high energy per atom to the target that defeats the purpose of using a cluster beam. A low percentage of atoms present as clusters also slows deposition of clusters, reducing the commercial efficiency of the deposition apparatus.

There therefore exists a need for a new type of evaporative cluster source having improved cluster forming efficiency. The present invention fulfills this need, and further provides related advantages.

SUMMARY OF THE INVENTION

The present invention provides an evaporative cluster source for nonvolatile species having improved cluster forming efficiency, as compared with prior evaporative cluster sources. The cluster source of the invention is based upon the heterogeneous nucleation of clusters, and is designed to maximize cluster formation by this mechanism. The source can be used for a wide variety of evaporative species, as long as the materials of the source are compatible with each species. The source is readily constructed, and can be operated in conjunction with the other components of comventional cluster deposition apparatus.

In accordance with the invention, a cluster source for nonvolatile species comprises crucible means for evaporating atoms of the species; cluster formation means for heterogeneously nucleating and growing clusters of the evaporated species, the cluster formation means being located adjacent to the crucible means so that atoms evaporated from the crucible means enter the cluster formation means; and temperature control means for maintaining the temperature of the crucible means and the cluster formation means at different temperatures.

It has been previously widely believed that the primary mechanism of cluster formation in an evaporative source is homogeneous cluster nucleation under the reduced pressure obtained when the evaporated atoms expand through the nozzle of the source. It has now been discovered that a higher efficiency of cluster formation can be achieved through heterogeneous nucleation of clusters on an interior cluster formation means, such as the interior walls, of the cluster source. With this improved understanding of the formation of clusters, a source adapted for improved nucleation and growth efficiency has been devised.

Efficient evaporation of atoms in the crucible is best accomplished with the crucible maintained at a relatively high temperature. The atoms emitted by the crucible are therefore at a high temperature. Under the prior homogeneous nucleation approach, the nozzle should be maintained at a higher temperature than the crucible to prevent deposition of droplets of the evaporant on the inner walls of the nozzle as the evaporated atoms pass therethrough.

For optimal heterogeneous nucleation, the portion of the source wherein cluster nucleation and growth occur should be at a lower temperature than the crucible. In the present apparatus, therefore, the cluster formation means is thermally isolated from the crucible means, so that the temperature of the cluster formation means can be maintained at a lower, more optimal temperature for the nucleation and growth of clusters prior to the clusters leaving the source. The cluster formation means is most readily selected as the interior wall of the cluster source, and the cluster formation surface is separately heated from the crucible portion of the source. A thermal barrier such as an insulating material or an open gap can aid in thermally isolating the two interior portions that are to be heated to different temperatures.

Heterogeneous nucleation of large numbeers of clusters can be further promoted by constructing the interior walls of a material which is not wetted by the atoms and clusters of the evaporated material. The material of construction can be selected based upon the selected evaporant. Some materials useful for various evaporants include graphite, diamond, amorhpous carbon, silicon carbide, boron carbide, and boron nitride.

Increased surface area of the cluster formation means and cluster formation surface also promotes heterogeneous nucleation of clusters and a high cluster formation efficiency. The interior profile of the cluster formation means portion of the cluster source can be made noncircular, to increase the relative surface area per unit contained volume.

The opening where the cluster beam is emitted from the source can be made part of the cluster formation means. Alternatively, there may be provided a third interior portion of the cluster source, an ejection means for ejecting the clusters from the source. The ejection means is positioned adjacent the cluster formation means, so that the formed clusters can escape from the source through the ejection means. The ejection means is then provided with a separate temperature control means, so that it may be selectively controlled to a temperature independent of the crucible means and the cluster formation means. The ejection means, where provided, is maintained at a temperature greater than that of the cluster formation means, to inhibit deposition of evaporant onto the ejection means to form droplets of the evaporative material thereon. Typically, where an ejection means is provided, the nozzle would be part of the ejection means and would be maintained at such a higher temperature.

An alternative cluster source for nonvolatile species comprises a crucible adapted for containing a source of a species to be evaporated, the crucible having first temperature control means for controlling the temperature of evaporation; and a cluster formation surface outside of and adjacent to the crucible and positioned to receive evaporated atoms from the crucible, the cluster formation surface having second temperature control means for controlling the temperature of the cluster formation surface. The cluster formation surface is constructed of a material which is not wet by the selected evaporative species, and optionally, has a noncircular cross section perpendicular to the axis of the cluster beam to enlarge the amount of available cluster formation surface relative to the cross sectional area of the beam.

The cluster source of the invention promotes heterogeneous nucleation, since the cluster formation surface is typically operated at a temperature less than that of the crucible. Evaporated atoms tend to briefly reside on the cluster formation surface, and during this residence clusters form between the resident atoms. The clusters move off the surface because of their thermal energy and the energy of the flow of evaporated atoms, and form the cluster beam. Because the resident atoms and clusters do not wet the cluster formation surface, they do not become permanently attached.

It will therefore be appreciated that the cluster source of the invention is an advance in the art of cluster deposition. The cluster source has a higher efficiency of cluster formation than prior evaporative cluster sources, and may be controlled more precisely. Other features and advantages of the invention will be apparent from the following more detailed description, taken in conjunction with the accompanying drawings, which illustrate, by way of example, the principles of the invention.

BRIEF DESCRIPTION OF THE DRAWINGS

FIG. 3 is a side sectional view of a three zone cluster source;

FIG. 4 is a side sectional view of another embodiment of two zone cluster source; and FIG. 5 is a sectional view of a portion of the apparatus of FIG. 4, taken generally on line 5—5.

DETAILED DESCRIPTION OF THE PREFERRED EMBODIMENT

Figure 1:
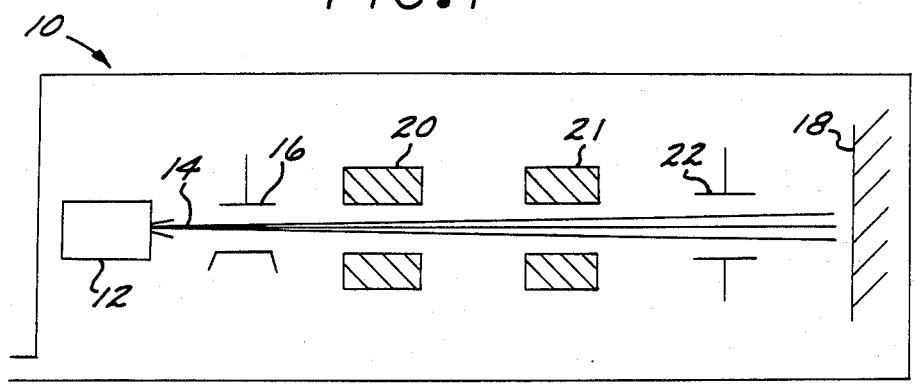
FIG. 1 is schematic illustration of a cluster beam deposition apparatus.

A cluster beam deposition apparatus 10 is depicted diagrammatically in FIG. 1, to illustrate the type of system in which the present invention finds application. The deposition apparatus 10 includes a cluster source 12 which produces a cluster beam 14 from evaporated atoms. (As used herein and in this context in the art, "atoms" can include single atoms, as well as molecules and complexes formed from more than one atom and chemically bonded together. By contrast, clusters are weakly bound assemblies of from 2 to about 10,000 atoms.) The cluster beam 14 is composed of clusters of various sizes, as well as some unclustered atoms. The clusters and atoms of the beam 14 are ionized in an ionizer 16, which is usually adjusted to give each cluster and atom a singly charge. That is, a cluster having 2000 atoms would have only a single charge, as would a single atom.

It is desired that only clusters of a narrow range of sizes reach a target 18. The beam 14 is therefore passed through a mass separator 20 which separates clusters significantly larger or smaller than the selected size, permitting only clusters of about the desired size to reach the target 18. The ionized clusters are accelerated in an accelerator 21, which typically comprises a pair of apertured electrodes through which the beam 14 passes. The second electrode is more negative than the first electrode, resulting in acceleration of the clusters of the beam 14, and an associated increase in their energy. Finally, the cluster beam 14 is focused and deflected by lenses and deflection plates 22, so that patterns of the clusters may be written across the surface of the target 18. The entire deposition apparatus is placed into a vacuum chamber 24, which maintains the target 18 and the cluster beam 14 in a vacuum.

Figure 2:
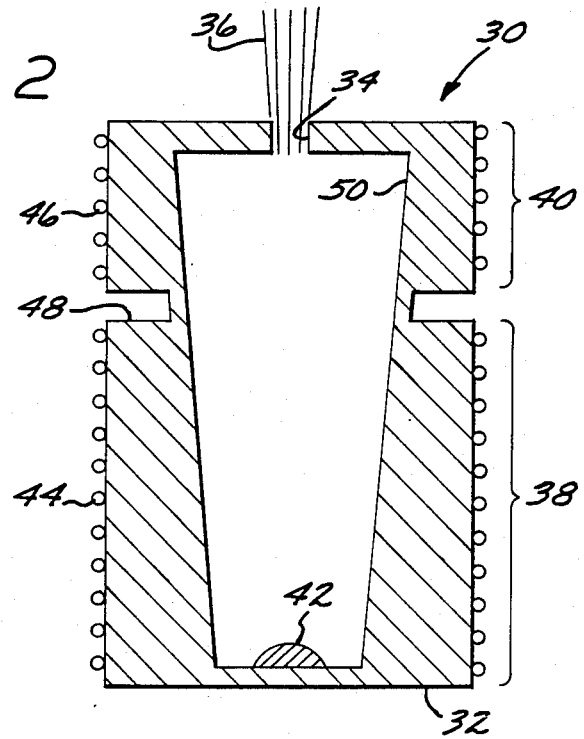
FIG. 2 is a side sectional view of a two zone cluster source.

The present invention is embodied in the cluster source, and is illustrated for three different embodiments in FIGS. 2–5. A two zone cluster source 30 is illustrated in FIG. 2. The cluster source 30 includes a housing 32 with an opening therethrough that serves as a nozzle 34 for the escape of an evaporant species upwardly as a cluster beam 36. The housing 32 has two portions, a crucible 38 at the lower end and a cluster formation portion 40 at the upper end. The crucible 38 contains a solid mass 42 of the species to be evaporated. The crucible 38 is resistance heated by a sufficient number of turns of electrical resistance wire, forming a crucible resistance heater 44 wound around the exterior of the housing 32. The cluster formation portion 40 is resistance heated by a sufficient number of turns of electrical resistance wire, forming a cluster formation resistance heater 46 wound around the exterior of the housing 32. Electrical current is passed through the heaters 44 and 46, and the resistance of the wires generates heat that is conducted into the housing 32.

The housing 32 includes a thermal isolation barrier 48 between the crucible 38 and the cluster formation portion 40. As illustrated, the thermal isolation barrier 48 is a portion of the housing 32 having a reduced diameter, forming a slot or gap between the crucible 38 and the cluster formation portion 40. The thermal isolation barrier 48 reduces heat transfor between the crucible 38 and the cluster formation portion 40, so that the different temperatures can be readily maintained within the two zones of the housing 32.

The interior wall of the cluster formation portion 40 is a cluster formation surface 50 which is the location at which the clusters are formed. The cluster formation surface 50 is made of a material which is not wetted by the evaporant species being evaporated from the crucible 38. Evaporant atoms of the mass 42 are evaporated at the elevated temperature maintained within the crucible 38, and drift upwardly to contact the cluster formation surface 50. The atoms briefly reside in contact with and on the surface 50, and during this resident period a number of atoms can move together to form a cluster nucleus. The cluster nucleus grows by a surface assisted diffusional growth process while on the surface 50, but eventually the cluster separates from the surface 50 and is swept by the evaporant stream and pressure differential out of the nozzle 34 and into the cluster beam 36. In this embodiment, the interior surface of the nozzle 34 is part of the cluster formation surface 50, and clusters form and grow in contact with the interior of the nozzle 34.

The selection of the material of construction of the cluster formation surface 50 depends upon the evaporant species. The surface 50 should present a surface to the impinging evaporant atoms that is not wet by these atoms and by clusters of these atoms. Non-wetting materials can be selected from information in available references, or determined by experimentation. Examples of operable materials of construction for the surface 50 include graphite, diamond, amorphous carbon, silicon carbide, boron carbide, and boron nitride, for use with the following evaporant materials: copper, silver, gold, zinc, cadmium, mercury, gallium, indium, thallium, germanium, tin, lead, arsenic, antimony, bismuth, selenium, tellurium and polonium. In FIG. 2, the entire cluster source 30 is illustrated as being constructed of a single material of construction, as in this case a single material is usable both as a crucible for holding the mass 42 and as the cluster formation surface 50. The cluster source can, however, be constructed of different materials should one material be optimal for the crucible 38, and another be optimal for the cluster formation surface 50.

FIG. 3 illustrates a three zone embodiment of a cluster source 52. The source 52 includes a crucible 54 for holding the mass 56 of the species to be evaporated. A cluster formation portion 58 is above the crucible 54 and receives the flow of evaporant therefrom. An ejection section 60 is above the cluster formation portion 58 and receives the flow of clusters and atoms therefrom. The crucible 54 is separated from the cluster formation portion 58 by an insulator 62, and the cluster formation portion 58 is separated from the ejection section 60 by an insulator 64, which can be any suitable high temperature insulation such as a ceramic fiber. The crucible 54, cluster formation portion 58, and ejection section 60 are provided with their own individual resistance heaters 66, 68, and 70, respectively, so that the three zones can be separately heated and equilibrated to different temperatures. In the illustrated embodiment of FIG. 3, each of the crucible 54, the cluster formation portion 58, and the ejection section 60 are made of a different material, and are joined together to form a continuous structure.

In operation, the crucible 54 is heated to a temperature that is optimal for the evaporation of the evaporant from the mass 56. The cluster formation portion 58 is maintained at a lower temperature that is optimal for the nucleation and growth of clusters. The ejection section 60 is maintained at a temperature that is higher than that of the cluster formation portion 58, to prevent deposition of evaporant on the interior surfaces of the ejection section 60 to form droplets. Such droplets would be ejected to splatter on the film being deposited, impairing the quality of the film. In the source 52, the cluster beam 72 escapes from the source through a nozzle 74 at the top end of the ejection section 60. In this embodiment, as compared with the embodiment illustrated in FIG. 2, the nozzle 74 would participate little, if at all, in the process of nucleating and growing clusters.

FIG. 4 illustrates another two zone embodiment of a source 76. In this design, there is provided a container 78 which encloses the remainder of the components of the source 76, but does not itself form one of those components. Within the container 78 is a crucible 80 and a separately supported cluster formation structure 82. A mass 84 of the species to be evaporated is contained within the crucible 80. The crucible 80 is heated by an electron beam heater 86, and the cluster formation structure 82 is heated by a separate electron beam heater 88. Heat shields 90 surround the crucible 80 and the cluster formation structure 82.

The cluster formation structure 82 is formed in two pieces, a cluster formation surface base 92 and a support structure 94. The cluster formation surface base 92 is selected for optimum participation in the nucleation and growth of clusters in contact therewith, as discussed previously, and the support structure 94 is selected for its ability to support the base 92. This approach may be necessary if the optimum material for the cluster formation surface base 92 is particularly brittle or expensive.

FIG. 5 illustrates the noncircular cross section of the cluster formation surface base 92. The noncircular cross section is chosen to increase the surface area of the base 92 available to serve as a heterogeneous nucleation and growth substrate for cluster formation, relative to the total area of the cluster beam. The large amount of surface area increases the opportunity for atoms of evaporant to attach themselves to surface, thereby increasing the cluster forming efficiency of the source.

It will now be appreciated that the source of the present invention increases the efficiency of cluster formation of nonvolatile species in cluster beam deposition systems. The cluster source of the invention can be constructed in an optimized manner that promotes its use. Although a particular embodiment of the invention has been described in detail for purposes of illustration, various modifications may be made without departing from the spirit and scope of the invention. Accordingly, the invention is not to be limited except as by the appended claims.

What is claimed is:

1. A cluster source for nonvolatile species, comprising:
   crucible means for evaporating atoms of the species;
   cluster formation means for heterogeneously nucleating and growing clusters of the evaporated species, wherein at least a portion of said cluster formation means is constructed of a material which is not wet by the selected species, said cluster formation means being located adjacent to said crucible means so that atoms evaporated from said crucible means enter said cluster formation means; and
   temperature controls means for maintaining the temperature of said cluster formation means at a lower temperature than said crucible means.

2. The cluster source of claim 1, wherein said cluster formation means includes a surface upon which clusters are formed, and said surface is constructed of a material selected from the group consisting of graphite, diamond, amorphous carbon, silicon carbide, boron carbide, and boron nitride.

3. The cluster source of claim 1, wherein said crucible means and said cluster formation means are included within a single housing, and said temperature control means includes a thermal isolation barrier between said crucible means and said cluster formation means, so that each of said means may be maintained at a selected temperature.

4. The cluster source of claim 3, wherein said thermal isolation barrier is a slot between said crucible means and said cluster formation means.

5. The cluster source of claim 1, wherein said cluster formation means is located external of said crucible means.

6. The cluster source of claim 1, wherein said cluster formation means has a noncircular cross section.

7. The cluster source of claim 1, wherein said temperature control means includes two separate heaters, one for heating said crucible means and the other for heating said cluster formation means.

8. The cluster source of claim 1, further including ejection means for ejecting clusters from said source, said ejection means being located adjacent said cluster formation means so that clusters formed in said cluster formation means enter said ejection means, and wherein said temperature control means permits said ejection means to be maintained at a temperature different from said crucible means and said cluster formation means.

9. A cluster source for nonvolatile species, comprising:
   a crucible adapted for containing a species to be evaporated, said crucible having first temperature control means for controlling the temperature of evaporation;
   a cluster formation surface outside of and adjacent to said crucible and positioned to receive evaporated atoms from said crucible, wherein at least a portion of said cluster formation surface is constructed of a material which is not wet by the selected species, said cluster formation surface having second temperature control means for controlling the temperature of said cluster formation surface to enable the cluster formation surface to be maintained at a lower temperature than said crucible.

10. The cluster source of claim 9, wherein said cluster formation surface includes a nozzle for ejecting clusters from said cluster source.

11. The cluster source of claim 10, wherein said nozzle has a non-circular cross section.

12. The cluster source of claim 9, wherein said cluster formation surface is constructed of a material selected from the group consisting of graphite, diamond, amorphous carbon, silicon carbide, boron carbide, and boron nitride.

13. The cluster source of claim 9, wherein said crucible and said cluster formation surface are included within a single housing, and one of said temperture control means includes a thermal isolation barrier between said crucible and said cluster formation surface, so that said cluster formation surface may be maintained at a temperature different from that of said crucible.

14. The cluster source of claim 13, wherein said thermal isolation barrier is a slot between said crucible and said cluster formation surface.

15. The cluster source of claim 9, wherein each of said temperature control means includes a heater.

16. The cluster source of claim 9, further including an ejector located adjacent said cluster formation surface so that clusters formed in said cluster formation means enter said ejection means, said ejector including third temperature control means for controlling the temperature of said ejector.

* * * * *